(12) United States Patent
Yang et al.

(10) Patent No.: US 7,955,112 B2
(45) Date of Patent: Jun. 7, 2011

(54) CARD-EDGE CONNECTOR HAVING LATCHES INTERLOCKED WITH PRINTED CIRCUIT BOARD

(75) Inventors: Sheng-Ho Yang, Tu-Cheng (TW); Chia-Shih Lin, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/648,312

(22) Filed: Dec. 29, 2009

(65) Prior Publication Data
US 2010/0167570 A1 Jul. 1, 2010

(30) Foreign Application Priority Data
Dec. 29, 2008 (TW) .................................. 97223506

(51) Int. Cl.
*H01R 13/62* (2006.01)
(52) U.S. Cl. ......................................... 439/328; 439/59
(58) Field of Classification Search .................... 439/59, 439/62, 157, 325, 326, 327, 328
See application file for complete search history.

(56) References Cited

U.S. PATENT DOCUMENTS

| | | | |
|---|---|---|---|
| 4,695,112 A * | 9/1987 | Maston et al. ................ 439/350 |
| 4,938,701 A * | 7/1990 | Heberling ........................ 439/65 |
| 5,020,999 A * | 6/1991 | Dewitt et al. .................. 439/328 |
| 5,211,571 A * | 5/1993 | Arai et al. ...................... 439/325 |
| 6,942,514 B1 * | 9/2005 | Cheng et al. .................. 439/328 |
| 6,945,825 B2 | 9/2005 | Aramoto et al. |
| 7,789,677 B2 * | 9/2010 | Yang et al. ...................... 439/83 |
| 2010/0167570 A1 * | 7/2010 | Yang et al. .................... 439/325 |

* cited by examiner

*Primary Examiner* — James Harvey
(74) *Attorney, Agent, or Firm* — Wei Te Chung; Andrew C. Cheng; Ming Chieh Chang

(57) ABSTRACT

An electrical connector includes an insulative housing and at least one terminal, the insulative housing having a front face, at least one cavity and at least one receiving slot formed in the front face for receiving a printed circuit board and communicating with the cavity. The terminal retained in the respective cavity has a base portion, a contact portion extending into the receiving slot for resiliently abutting against the printed circuit board and a tail portion extending rearward from the base portion. The insulative housing has at least one lock arm formed integral therewith to fasten the printed circuit board.

4 Claims, 15 Drawing Sheets

CARD-EDGE CONNECTOR HAVING LATCHES INTERLOCKED WITH PRINTED CIRCUIT BOARD

BACKGROUND OF THE INVENTION

1. Field of the Invention

The present invention relates to a card-edge connector, and more particularly, to a card-edge connector having latches interlocked with a printed circuit board on which it is attached.

2. Description of Related Art

U.S. Pat. No. 6,945,825 issued to Aramoto et al. on Sep. 20, 2005, discloses an electrical connector assembly including a pair of female and male connectors. The female connector comprises a female housing, a pair of reinforcement metals attached to the housing and a plurality of pin contacts retained in the housing. The tail portion of each pin contact as well as both the metals is soldered to a printed circuit board in a surface mounting fashion. The male connector comprises a male housing having two compartments and a plurality of socket contacts each crimped on the wire end and placed in the compartment of the housing. That does not meet the minimization requirement for the connector as well.

Hence, an improved electrical connector is required to overcome the disadvantages of the prior art.

SUMMARY OF THE INVENTION

Accordingly, an object of the present invention is to provide a card-edge connector having latches interlocked with a printed circuit board on which it is attached.

In order to achieve the above-mentioned object, an electrical connector comprises an insulative housing and at least one terminal, the insulative housing having a front face, at least one cavity and at least one receiving slot formed in the front face for receiving a PCB and communicating with the cavity. The terminal retained in the respective cavity has a base portion, a contact portion extending into the receiving slot for resiliently abutting against the PCB and a tail portion extending rearward from the base portion. The insulative housing has at least one lock arm formed integral therewith to fasten the PCB.

Other objects, advantages and novel features of the present invention will become more apparent from the following detailed description of the present embodiment when taken in conjunction with the accompanying drawings.

DETAILED DESCRIPTION OF THE INVENTION

Figure 1:
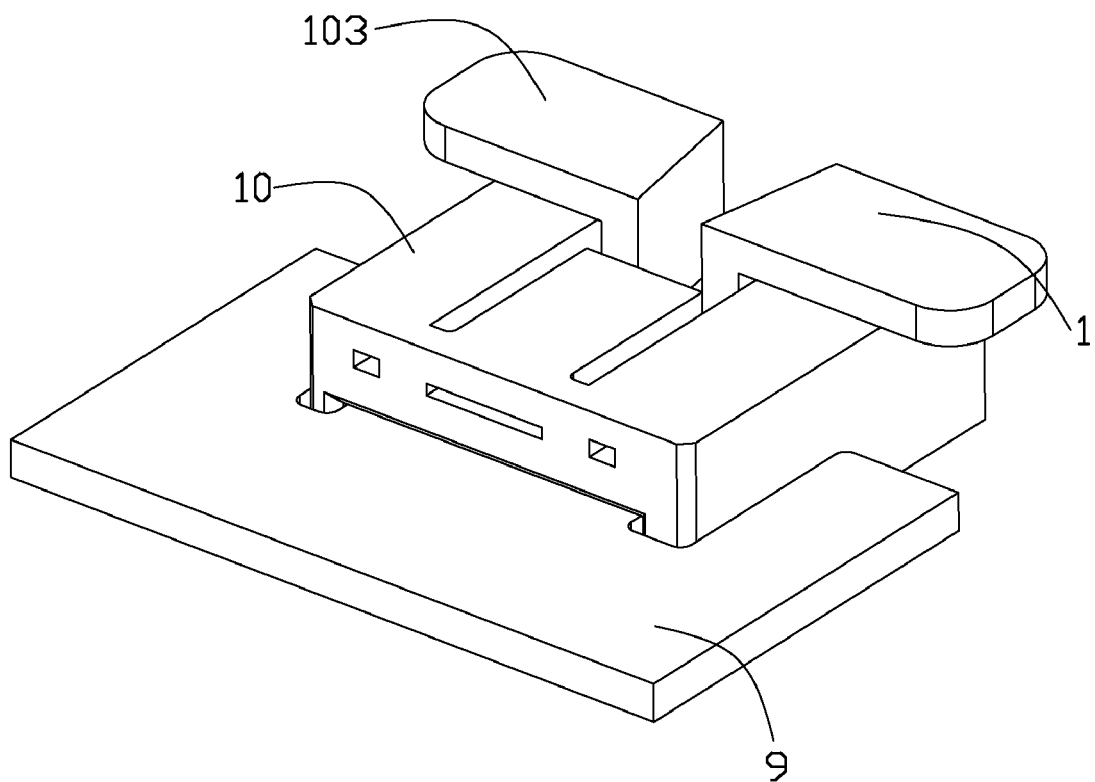
FIG. 1 is an perspective view of an electrical connector assembly according to a first embodiment of the present invention.

Now seven embodiments of the present invention will be described referring to the drawings.

Figure 2:
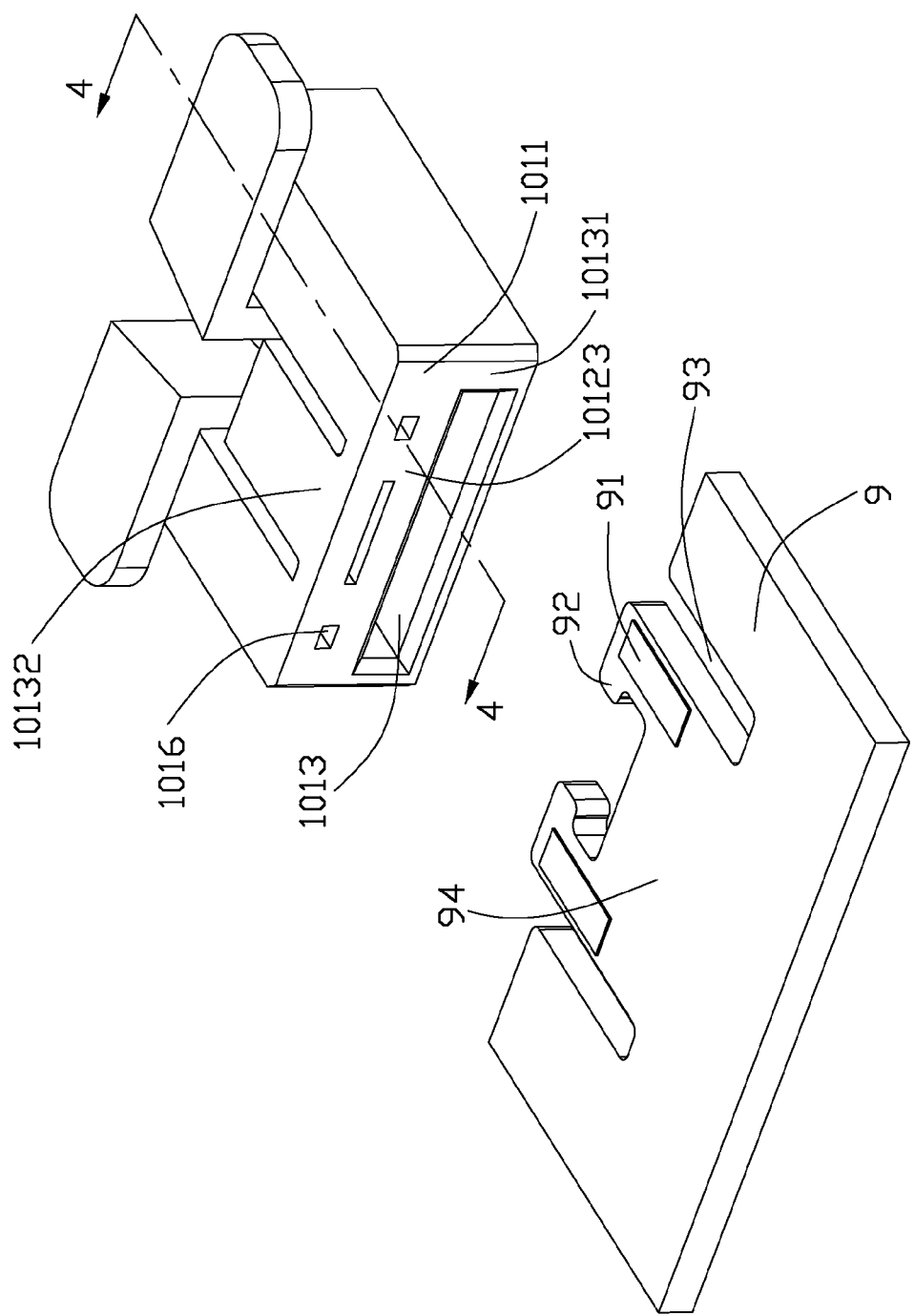
FIG. 2 is an exploded, perspective view of the electrical connector assembly shown in FIG. 1.
Figure 3:
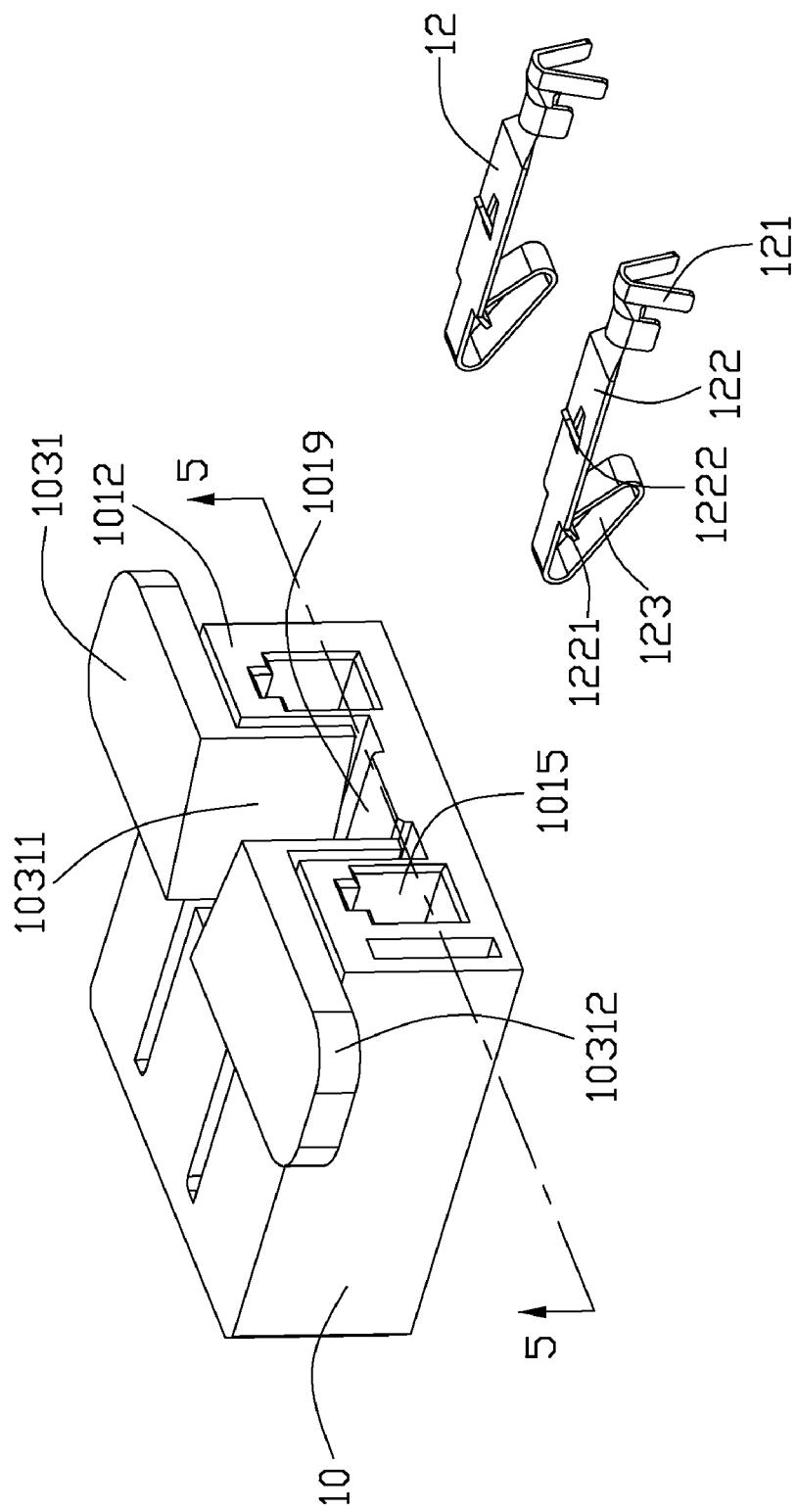
FIG. 3 is an exploded, perspective view of the electrical connector shown in FIG. 2.
Figure 4:
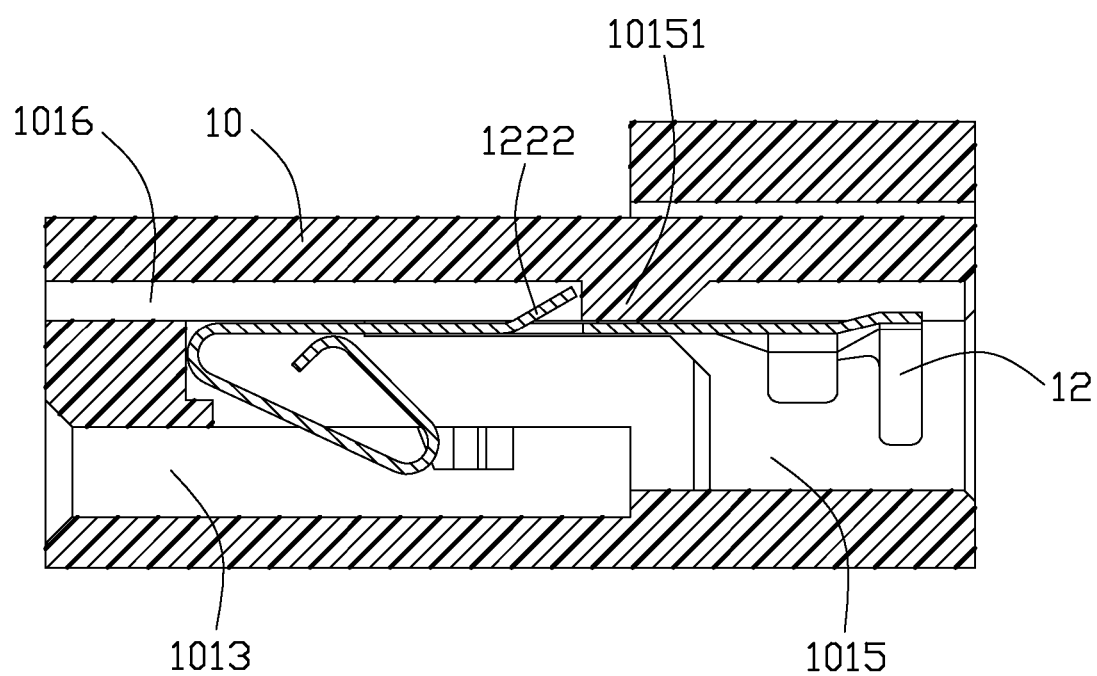
FIG. 4 is a cross-sectional view of the electrical connector shown in FIG. 2 along line 4-4.
Figure 5:
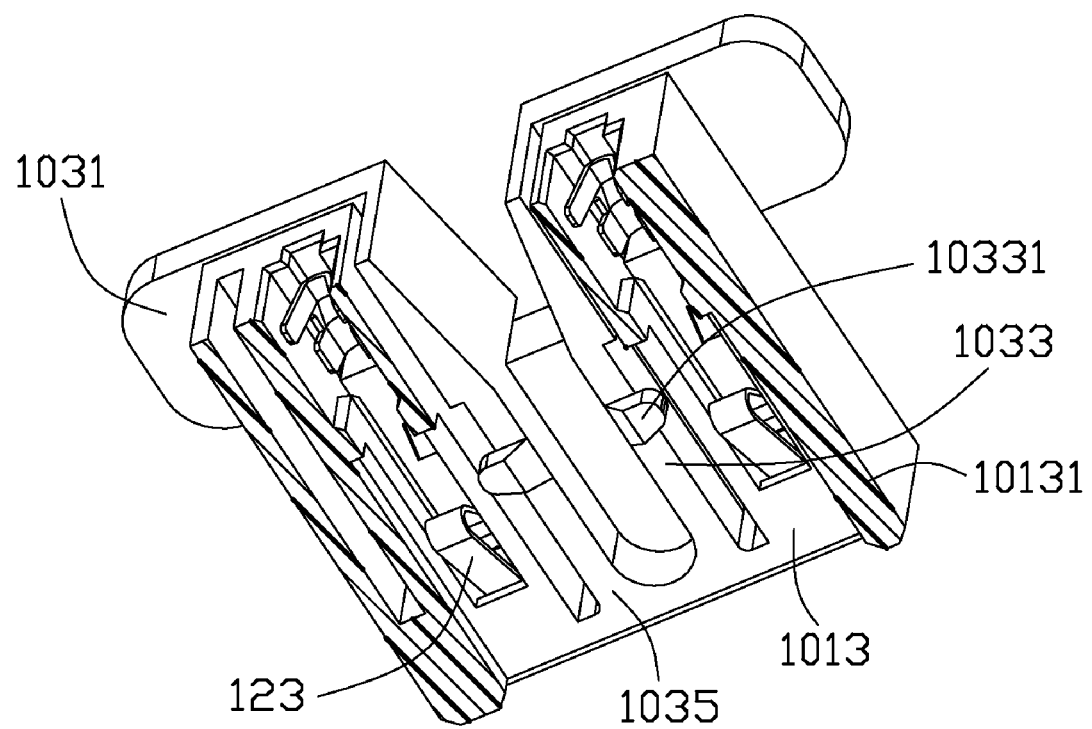
FIG. 5 is a perspective view of the electrical connector, the upper half of which is cutout along line 5-5.

FIGS. 1~5 show the first embodiment. Referring to FIGS. 1, 2 and 3, an electrical connector 1 adapted for electrically connecting wires (not shown) is coupled with a printed circuit board (PCB) 9 so as to complete an electrical connection between the PCB 9 and wires. The connector 1 includes an insulative housing 10 and a pair of terminals 12 retained in the insulative housing 10. The insulative housing 10 defines a front face 1011 and a longitudinal receiving slot 1013 for receiving the PCB 9 running through the front face 1011, which is surrounded by a pair of side walls 10131, opposite upper and lower walls 10132. Two cavities 1015 are formed in parallel with each other along the longitudinal direction and run through a rear face 1012, so that the terminals 12 crimped on wire ends are secured in the respective cavities 1015. As shown in FIG. 5, the receiving slot 1013 stop adjacent to a middle portion of the housing 10 in an inserting direction of the PCB and the cavities 1015 extend forwards beyond the slot 1013 but not pierce the front face 1012.

The terminal 12 inserted into one cavity 1015 opposite to the inserting direction, has a base portion 122, a contact portion 123 and a tail portion 121 extending rearward from the base portion 122 for electrically connecting with wires. The contact portion 123 extends from a front end of the base portion 122 and then bends toward the tail portion 121 and extends into the receiving slot 1013 for resiliently abutting against the PCB 9. The base portion 122 is wider than the contact portion 123, and two projections 1221 extend downwardly and forwardly from the front corners of the base portion 122 and engage the inner wall of each cavity 1015. Seeing FIG. 4, the upper wall of each cavity 1015 has a downward-projecting lug portion 10151 to engage with a lance 1222 stamped from the base portion so as to hold the terminals in place. A pair of holes 1016 extends forward from the lug portion 10151 and through the front face 1011, which communicates with the respective cavities 1015. Each hole 1016 is for insertion of a tool used to release the lance 1222 so as to remove the terminal 12 out of the housing 10 if required.

Referring now to FIG. 5 and FIG. 3, those two cavities 15 are spaced from each other with a distance and connected with each other by the lower wall 10132. A pair of lock arms 103 extend from a position 1035 which is located between the two cavities 1015 and adjacent to the front face 1011, and extends to the rear face 1012. Each lock arm 103 has an elastic arm 1033 extending rearward from said position 1035 and a push portion 1031 extending above the upper wall 10132 from the top edge of the elastic arm 1033 beyond the side wall 10131. A pair of detents 10331 is formed in the elastic arms 1033 and protrudes into the receiving slot 1013 respectively. Referring to FIG. 2, the PCB 9 comprises a mating portion 94 with conductive pads 91 for electrically connecting with the terminals 12. The mating portion 94 of the PCB 9 has a pair of pawls 92 for engagement with the detents 10331 of lock arms 103. Two cutouts 93 are engraved in the PCB 9 and located adjacent to the mating portion 94. Combination with FIG. 1, the side walls 10131 of the housing 10 cooperate with the corresponding cutouts 93 of the PCB 9 in order to prevent any reversed engagement of the housing with the PCB 9. Therefore, the thicknesses of the side walls 10131 are different, and the sizes of the two cutouts 93 are in harmony with the thicknesses of the side walls 10131 respectively.

In operation, squeezing the pair of lock arms 103 to make it move towards each other, the mating portion 94 of the PCB 9 is inserted into the receiving slot 1013, simultaneously and consequently with this process, the contact portions 123 of terminals 12 resiliently abut against the conductive pad 91 so as to establish an electric connection with the PCB 9. Then, the lock arms 103 will spring back to cause their detents 10331 to come into a clicking engagement with the pawls 92 of the PCB 9, thereby firmly fixing the PCB 9 in the insulative housing 10.

When the PCB 9 is to be released from the electrical connector 1, any user or operator may use his or her fingers to squeeze the push portions 1031 of the lock arms 103 towards each other. The lock arms 103 thus elastically moves towards each other will then to unlock the detents 10331 from the pawls 92, allowing the user or operator to grip the lock arms 103 and pull them back in order to remove the PCB 9 out of the housing 10.

Figure 6:
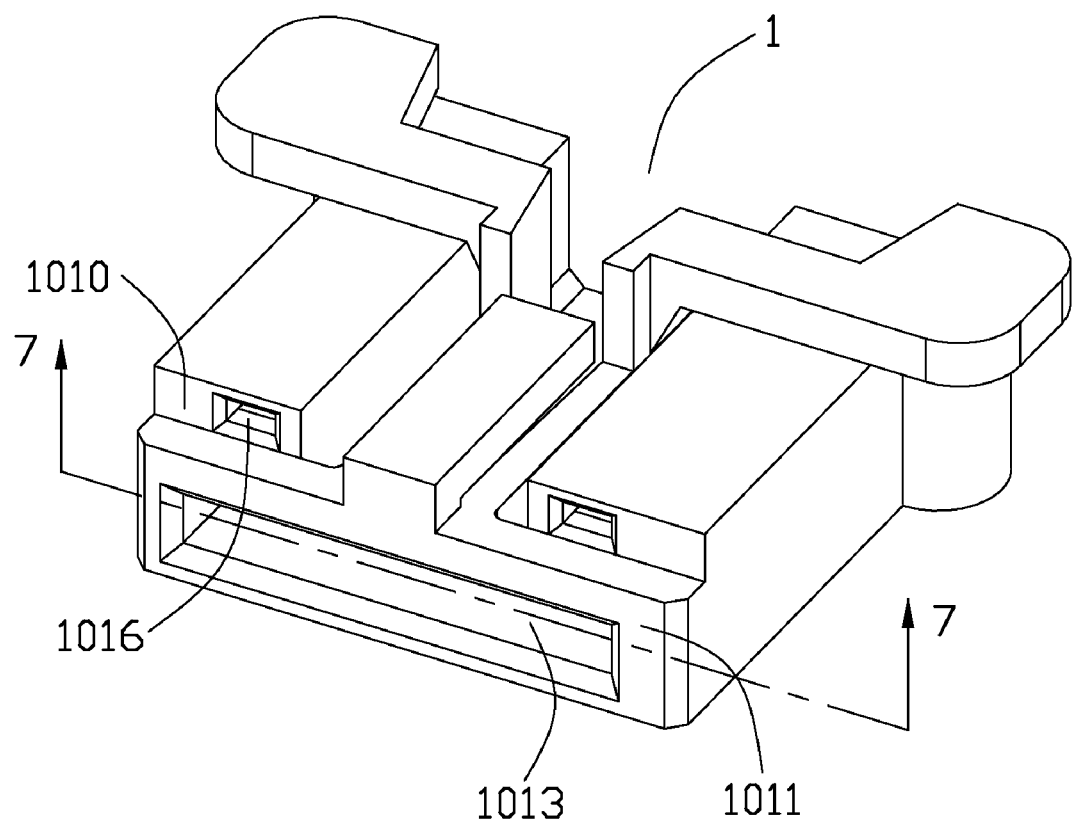
FIG. 6 is an perspective view of an electrical connector according to a second embodiment of the present invention.
Figure 7:
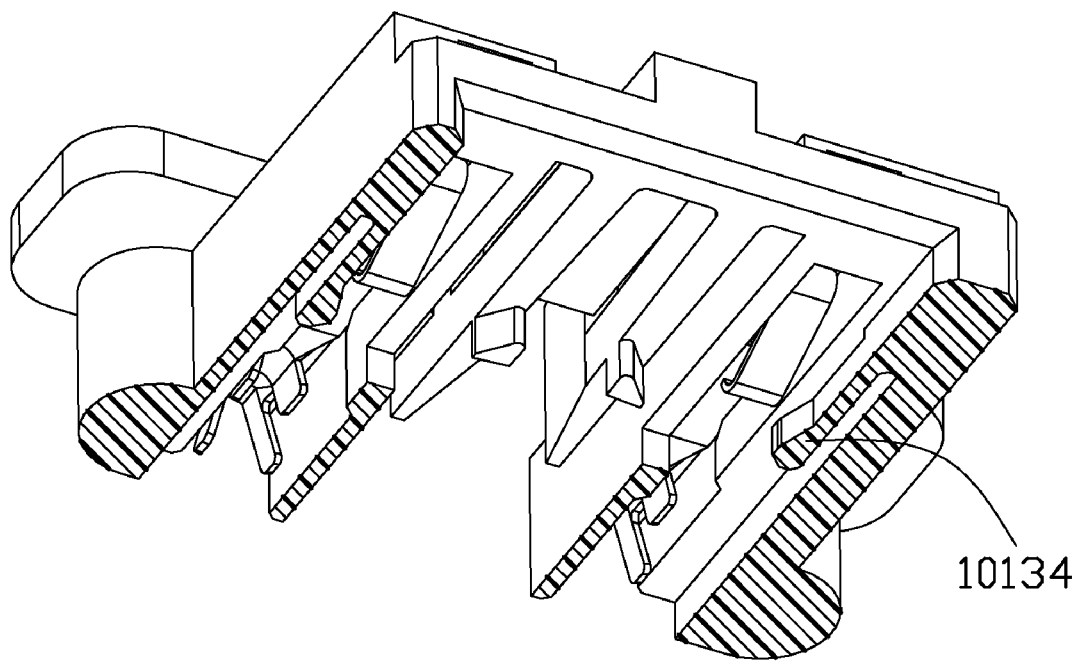
FIG. 7 is a perspective view of the electrical connector, the lower half of which is cutout along line 7-7.
Figure 8:
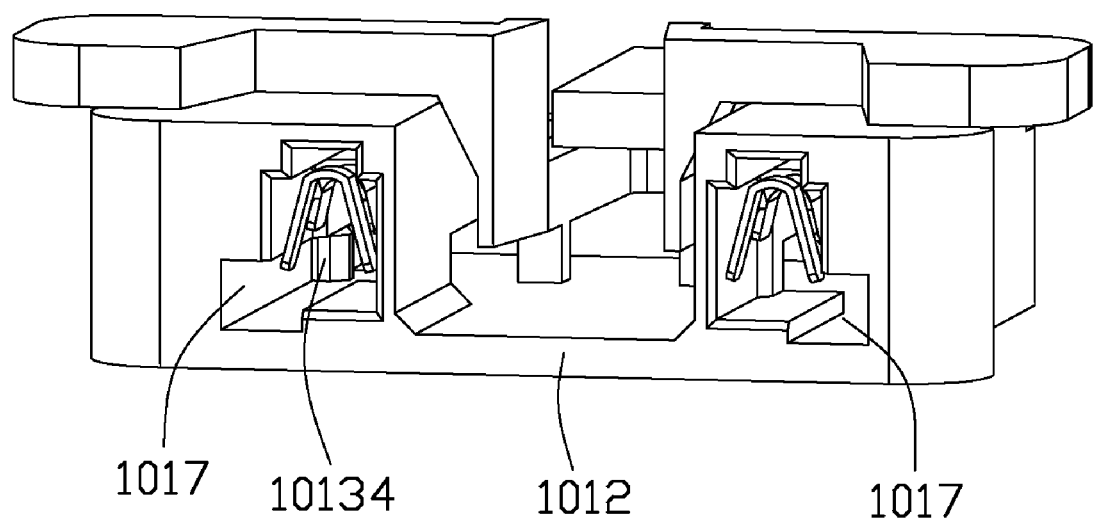
FIG. 8 is another perspective view of an electrical connector shown in FIG. 6.

FIGS. 6-8 show a second embodiment of the electrical connector 1 of the present invention. The insulative housing 10 defines a front face 1011 and a stepped surface 1010 offset from the front face 1011. A pair of holes 1016 communicating with corresponding cavities is formed in the stepped surface 1010 so as to facilitate manufacture and operation. A pair of retention arms 10134 is located in the inner face of the two side walls 10131 and extend from front to rear so as to engage with the mating portion of the PCB. A pair of second holes 1017 is formed in the rear face 1012 and communicates with the receiving slot 1013 so that any user or operator may examine the engagement of the PCB 9 with the retention arms 10134.

Figure 9:
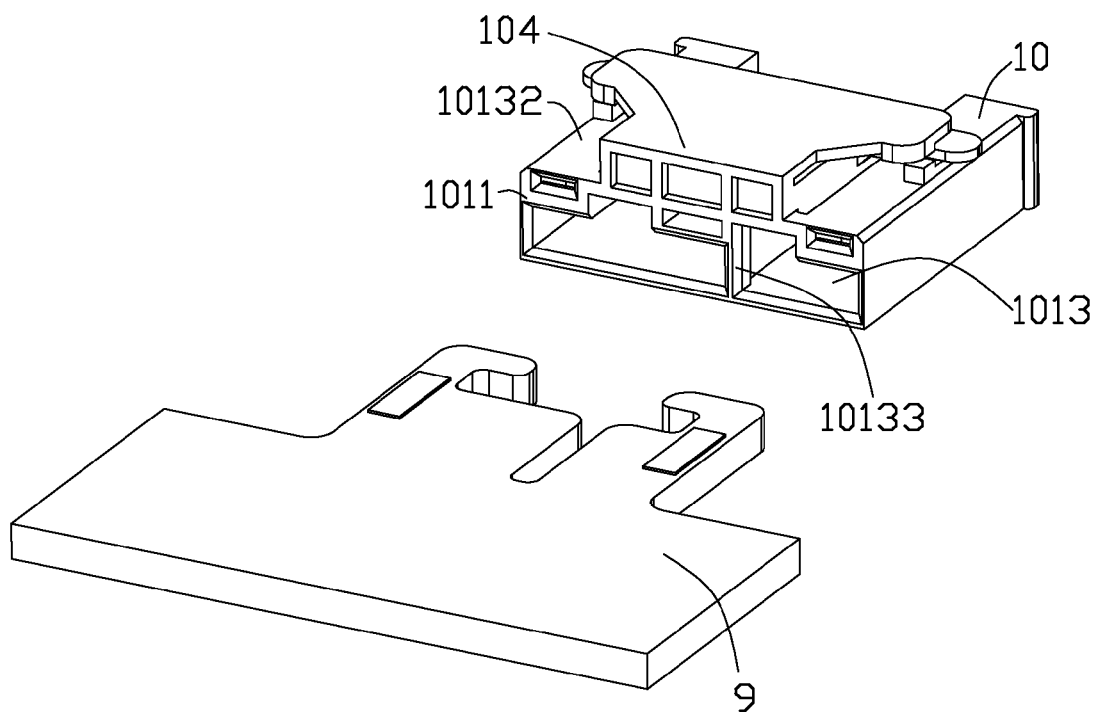
FIG. 9 is an exploded, perspective view of an electrical connector assembly according to a third embodiment of the present invention.
Figure 10:
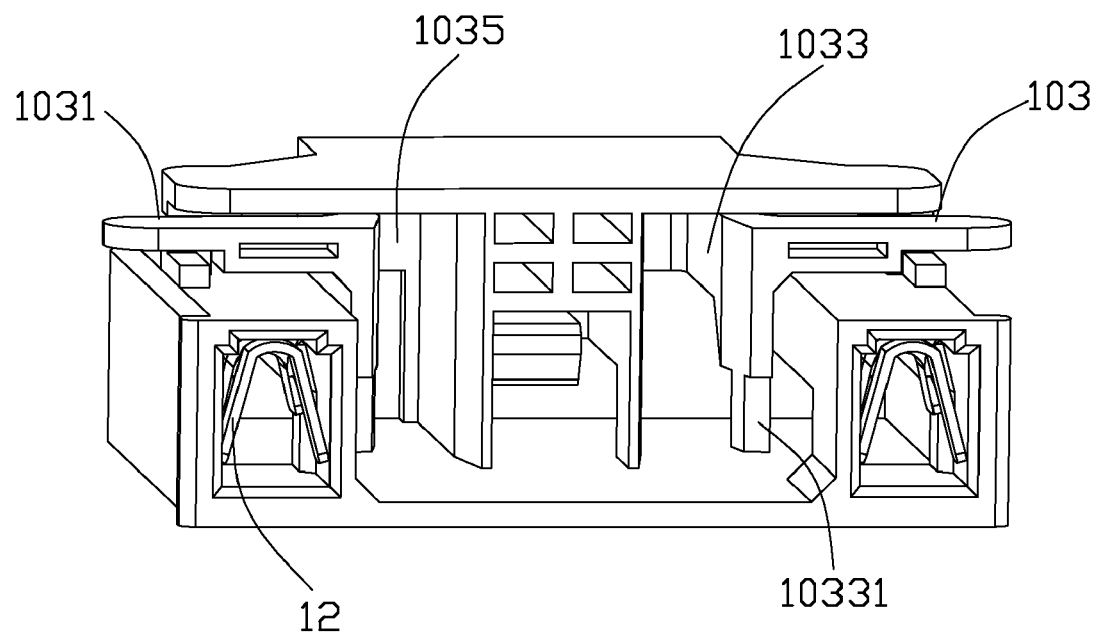
FIG. 10 is another perspective view of an electrical connector shown in FIG. 9.

FIGS. 9 and 10 show a third embodiment of the electrical connector 1 of the present invention. The electrical connector 1 includes an insulative housing 10 and two terminals 12 retained in the housing 10. The insulative housing 10 comprises a pair of cavities in parallel with each other and a pair of lock arms 103 extend from a top portion above the upper wall 10132. Each lock arm 103 has a position 1035 adjacent to the front face 1011 and formed in the top portion 104, an elastic arm 1033 extending rearward from the portion 1035 and a push portion 1031 extending above the upper wall 10132 from the top edge of the elastic portion 1033 beyond the side wall 10131. The detent 10331 is formed in the elastic arm 1033 and projects into the receiving slot 1013. A partition 10133 is formed in the slot 1013 so as to increase the intensity of the housing 10. The distance between the partition 10133 and one side wall 10131 is larger than that between the partition 10133 and the other wall 10131 in order to prevent any reversed engagement of the PCB 9 and the housing 10.

Figure 11:
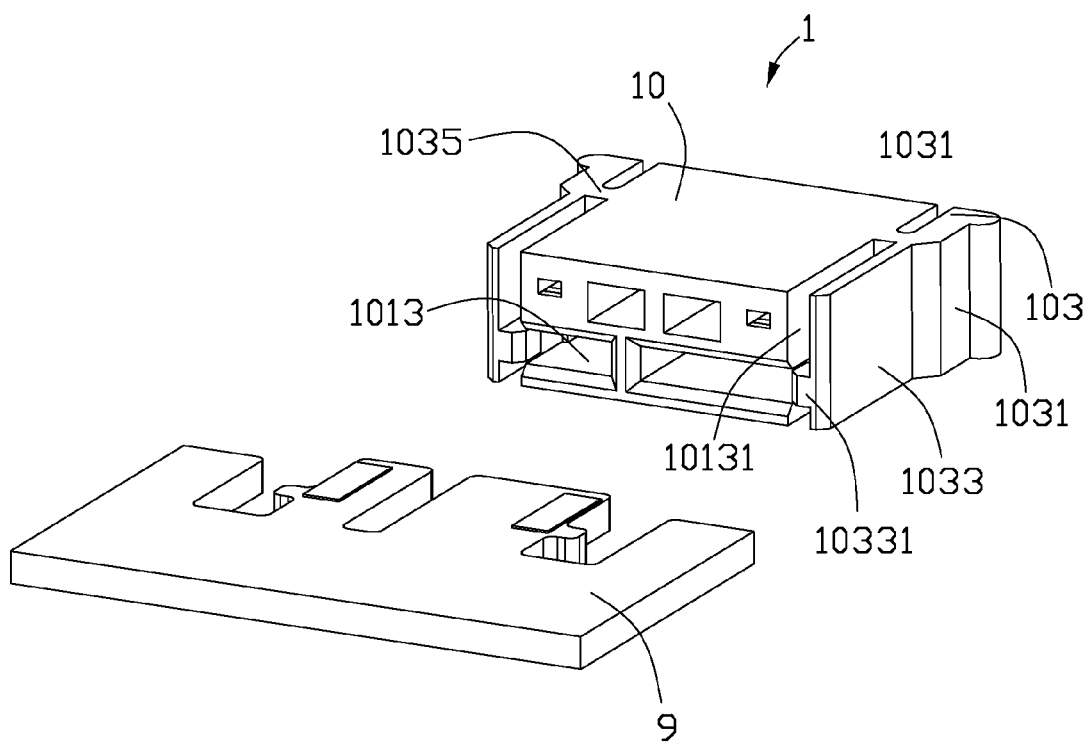
FIG. 11 is an exploded, perspective view of an electrical connector assembly according to a fourth embodiment of the present invention.

FIG. 11 shows a fourth embodiment of the electrical connector 1 and a PCB 9 of the present invention. The insulative housing 10 comprises two cavities, two receiving slots 1013 and a pair of lock arms 103 disposed on two sides, each slot 1013 penetrates through the respective side wall 10131. Each lock arm 103 comprises a portion 1035 extending sideward from the side surface of the respective side wall 10131, an elastic arm 1033 supported by the portion 1035 and a push portion 1031 extending sideward from one end of the elastic arm 1031, two detents 10331 protrudes from the inner face of the elastic arms 1031 into the receiving slot 1013.

Figure 12:
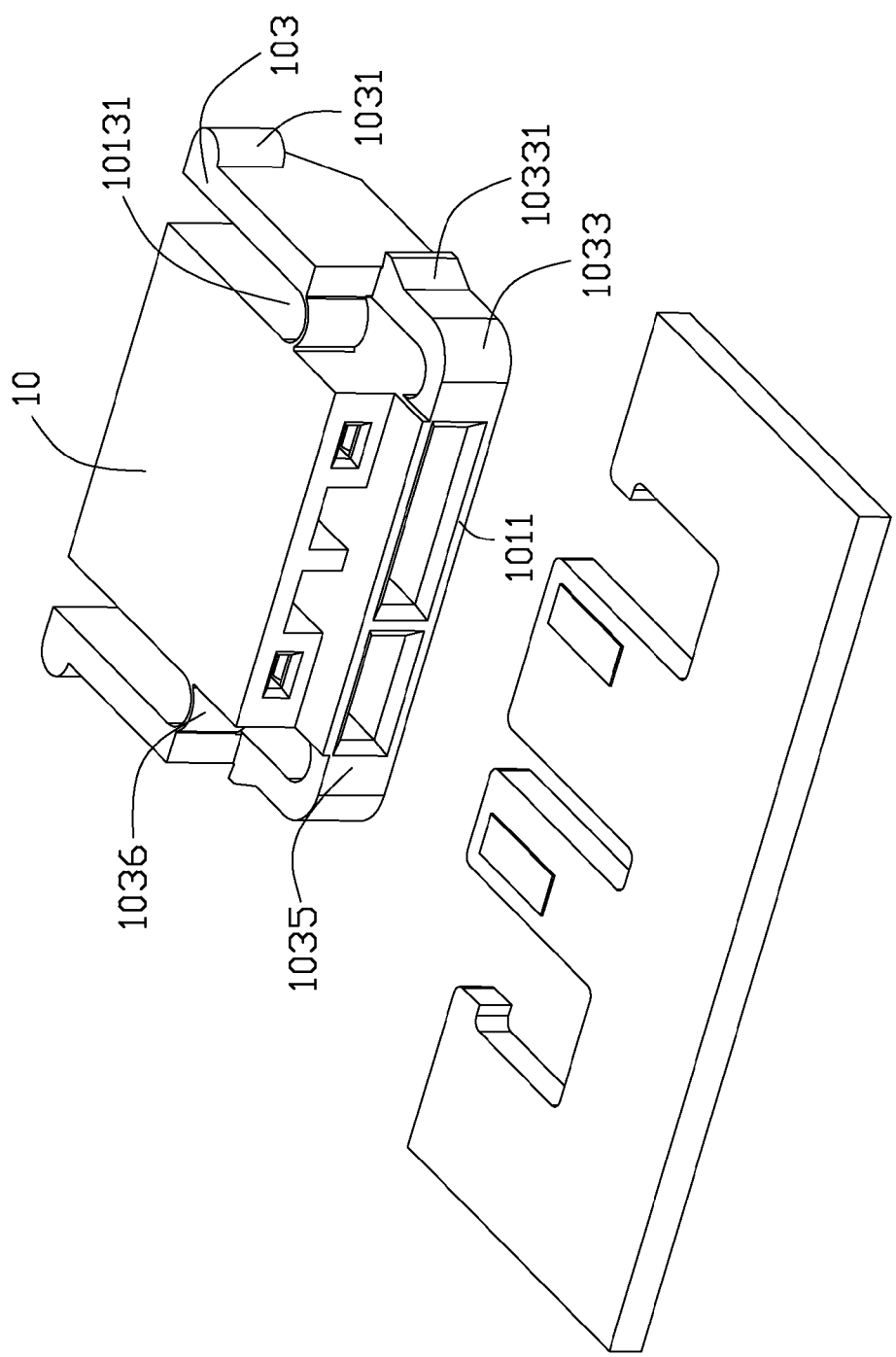
FIG. 12 is an exploded, perspective view of an electrical connector assembly according to a fifth embodiment of the present invention.

FIG. 12 shows a fifth embodiment of the electrical connector 1 of the present invention. The insulative housing 10 comprises a pair of lock arms 103 disposed on two sides, each lock arm 103 has a portion 1035 located adjacent to the front face 1011, an elastic arm 1033 extending rearward from the portion 1035, a push portion 1031 and the detent 10331 protruding outwards and sideways therefrom. The detent 10331 is formed in a front portion of the elastic arm 1033. A elastic ear 1036 connecting the elastic arm 1033 with the side wall 10131 is located between the elastic ear 1035 and the push portion 1031.

Figure 13:
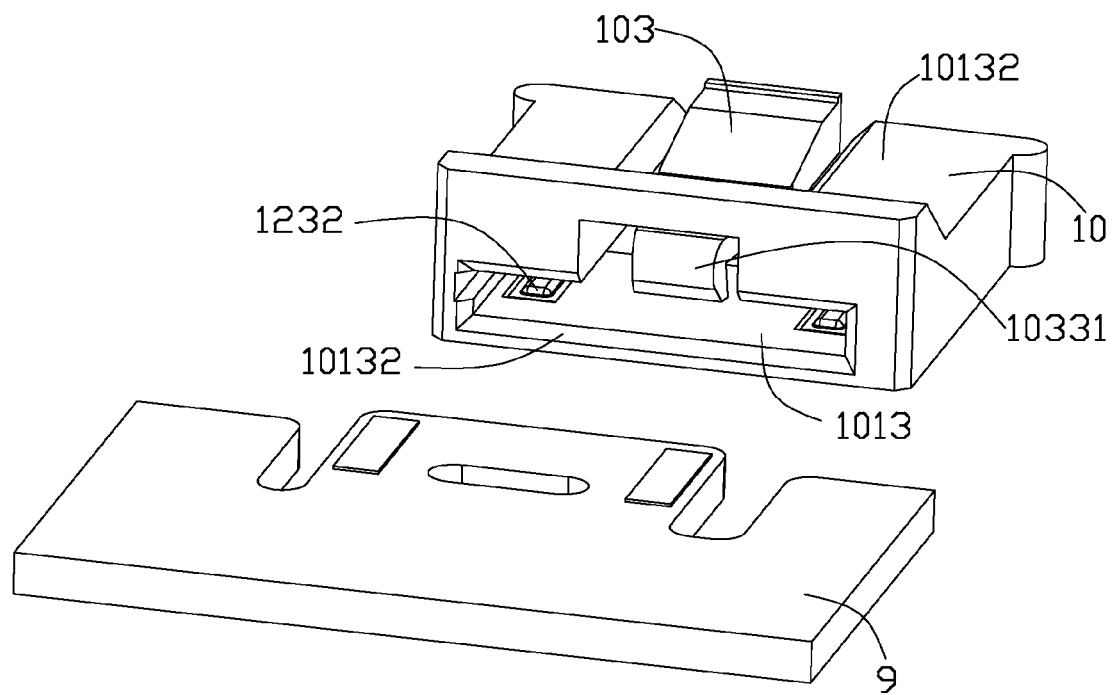
FIG. 13 is an exploded, perspective view of an electrical connector assembly according to a sixth embodiment of the present invention.
Figure 14:
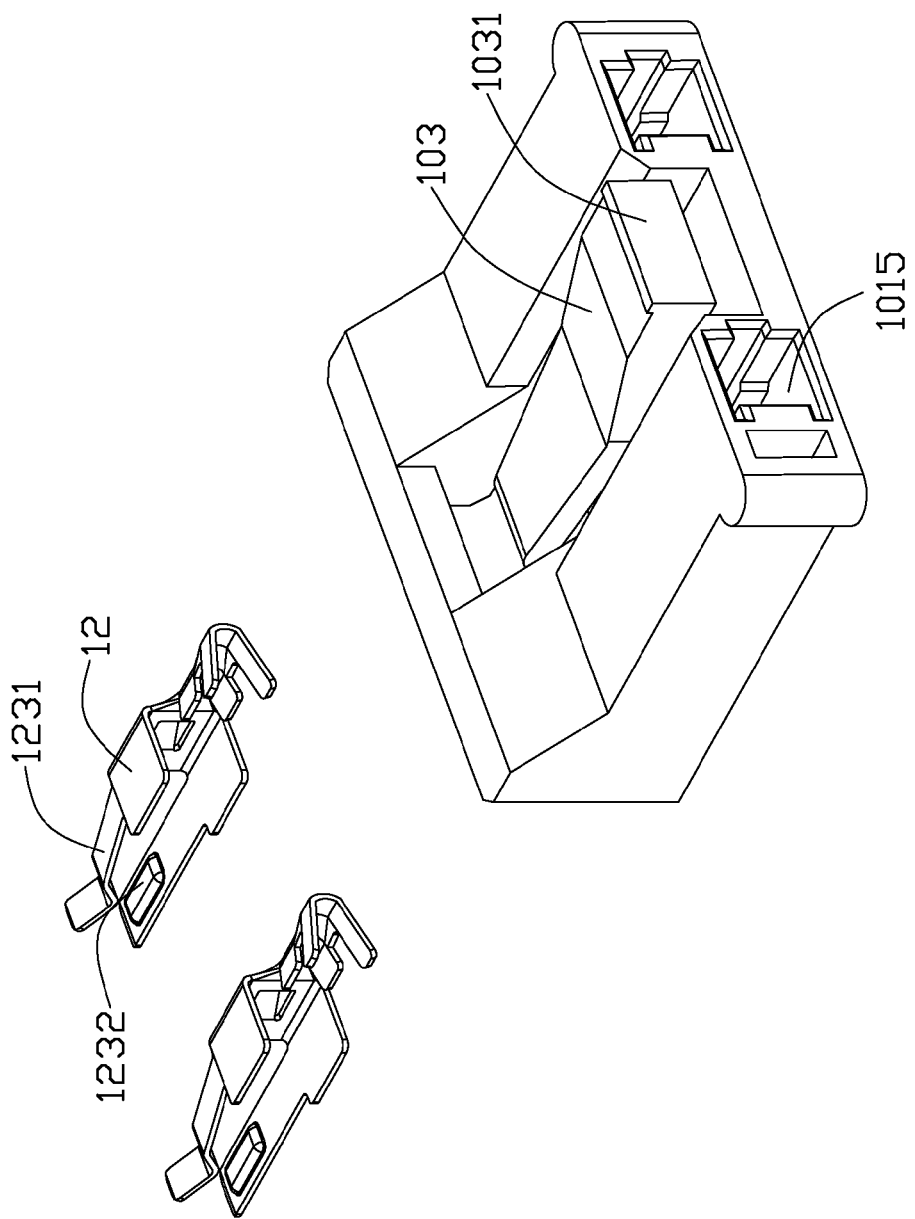
FIG. 14 is an exploded, perspective view of the electrical connector shown in FIG. 13.

FIGS. 13 and 14 show a sixth embodiment of the electrical connector 1 of the present invention. The electrical connector 1 comprises an insulative housing 10 and two terminals 12. The insulative housing 10 comprises two separate cavities 1015, a receiving slot 1013 and a lock arm 103 located between the two cavities 1015, the lock arm 103 has a portion, an elastic arm 1033 supported by the portion and the detent 10331 protruding downwardly into the receiving slot 1013 and a push portion 1031, the portion is located between the detent 10331 and the push portion 1031. Each terminal 12 comprises a first contact portion 1231 extending into the receiving slot 1013 and an opposite second contact portion 1232 disposed on the inner surface of the lower wall 10132.

Figure 15:
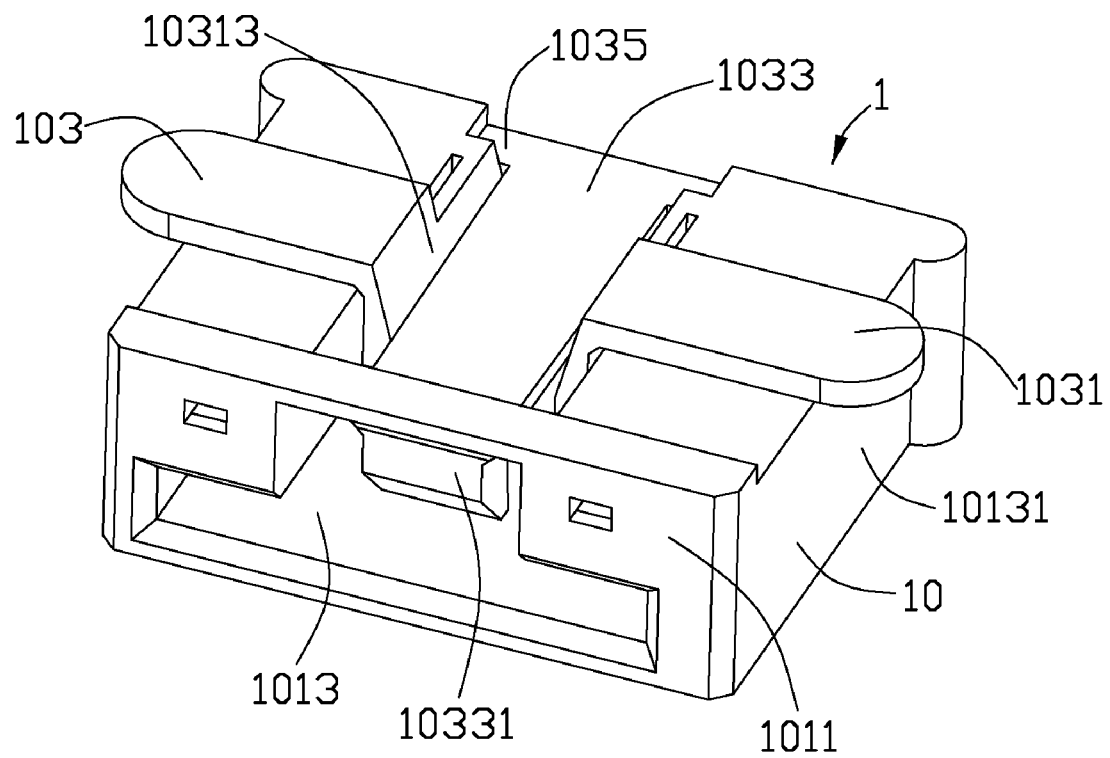
FIG. 15 is a perspective view of an electrical connector according to a seventh embodiment of the present invention.

FIG. 15 shows a seventh embodiment of the electrical connector 1 of the present invention. The insulative housing 10 comprises two separate cavities, a receiving slot 1013 and a lock arm 103 located between the two cavities, the lock arm 103 comprises a portion 1035 formed adjacent to a rear face, a wedged-shape elastic arm 1033 extending forwardly from the portion 1035 and the detent 10331 extending downwardly from a tip end of the elastic arm 1033 and a pair of push portions 1031 with mating surfaces 10313 for urging the elastic arm 1033 moving upward, each push portion 1031 has a wing extending beyond the outside surface of the respective side wall 10131.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. An electrical connector comprising:
   an insulative housing defining a front face, at least one longitudinal receiving slot running through the front face for receiving a printed circuit board (PCB) and at least one cavity running through a rear surface and communicating with the receiving slot; and
   at least one terminal retained in the respective cavity, the terminal having a base portion, a contact portion extending into the receiving slot for resiliently abutting against the printed circuit board and a tail portion extending rearward from the base portion;
   wherein the insulative housing has at least one lock arm formed integral therewith to fasten the PCB;
   wherein the insulative housing comprises a pair of side walls and opposite upper and lower walls surrounding the receiving slot, the lock arm has a detent protruding into the receiving slot for engagement with the PCB;

wherein the insulative housing comprises a pair of cavities in parallel with each other along the longitudinal direction and running through a rear face and a pair of lock arms located between the two cavities, each lock arm has an elastic arm extending rearward from a portion located between the two cavities and a push portion extending above the upper wall from the top edge of the elastic arm beyond the side wall.

2. The electrical connector as described in claim 1, wherein a pair of retention arms is formed in the inner face of the receiving slot.

3. An electrical connector assembly comprising:

a PCB having a mating portion with at least one lock portion;

an insulative housing defining a front face, at least one longitudinal receiving slot running through the front face for receiving a printed circuit board (PCB) and at least one cavity running through a rear surface and communicating with the receiving slot; and at least one terminal retained in the respective cavity, the terminal having a base portion, a contact portion extending into the receiving slot for resiliently abutting against the PCB and a tail portion extending rearward from the base portion for electrically connecting with wires;

wherein the insulative housing has at least one lock arm formed integral therewith, the lock arm has at least one detent for engagement with the pawl of the PCB;

wherein the insulative housing comprises a pair of cavities in parallel with each other along the longitudinal direction and running through a rear face and a pair of lock arms located between the two cavities, each lock arm has an elastic arm extending rearward from a portion located between the two cavities and a push portion extending above the upper wall from the top edge of the elastic arm beyond the side wall.

4. An electrical connector assembly comprising:

a printed circuit board defining a planar mating edge region with at least one conductive trace and at least an immoveable latch thereon;

an electrical connector including an insulative housing defining at least one mating slot receiving said mating edge region therein;

at least one conductive contact disposed in the housing with a contacting section exposed in the mating slot and mating with the conductive trace; and at least a moveable latch formed on the housing and in latchable engagement with the immoveable latch to retain said connector to the printed circuit board;

wherein said moveable latch is located in said mating slot;

wherein said moveable latch is unitarily formed with the housing;

wherein said moveable latch is equipped with a handle easily accessible from an exterior;

wherein said handle is disposed on a higher plane than parallel planes that said housing and said printed circuit board are disposed on;

wherein said moveable latch is moveable on a plane parallel to said printed circuit board.

\* \* \* \* \*